United States Patent [19]

Unozawa

[11] Patent Number: 5,298,456
[45] Date of Patent: Mar. 29, 1994

[54] METHOD OF MANUFACTURING SEMICONDUCTOR LASER

[76] Inventor: Kosei Unozawa, c/o NEC Corporation, 7-1, Shiba 5-chome, Minato-ku, Tokyo, Japan

[21] Appl. No.: 946,757

[22] Filed: Sep. 17, 1992

[30] Foreign Application Priority Data

Sep. 27, 1991 [JP] Japan .................. 3-248591

[51] Int. Cl.$^5$ ........................... H01L 21/20
[52] U.S. Cl. .................. 437/126; 437/129; 437/133; 437/141; 437/248; 372/45
[58] Field of Search ........... 437/126, 133, 129, 141, 437/248; 372/45

[56] References Cited

U.S. PATENT DOCUMENTS

| | | | |
|---|---|---|---|
| 4,566,171 | 1/1986 | Nelson et al. | 437/129 |
| 4,569,721 | 2/1986 | Hayakawa et al. | 437/129 |
| 4,835,117 | 5/1989 | Ohba et al. | 437/129 |
| 5,190,891 | 3/1993 | Yokotsuka et al. | 437/129 |
| 5,192,711 | 3/1993 | Murakami et al. | 437/129 |

FOREIGN PATENT DOCUMENTS 2-178918  7/1990  Japan .................. 437/129

OTHER PUBLICATIONS

Tohru Suzuki et al., "Band-Gap Energy Anomaly and Sublattice Ordering in GaInP and AlGaInP Grown by Metalorganic Vapor Phase Epitaxy", Japanese Journal of Applied Physics, vol. 27, No. 11, Nov., 1988, pp. 2098-2106.

H. Okuda et al., "Laser Parameter Dependence of In-GaAlP Transverse-Hode Stabilized SBR Lasers", the Extended Abstracts of the 36th Spring Meeting Japanese Society Applied Physics, 1989, p. 886 1p-ZC-4, month unknown.

*Primary Examiner*—Olik Chaudhuri
*Assistant Examiner*—Ramamohan Rao Paladugu

[57] ABSTRACT

In a method of manufacturing a semiconductor laser according to the present invention, an n-type $(Al_yGa_{1-y})_{0.5}In_{0.5}P$ ($0.5 \leq y \leq 1$) cladding layer, an $(Al_zGa_{1-z})_{0.5}In_{0.5}P$ ($0 \leq z \leq 0.3$) active layer, a p-type $(Al_yGa_{1-y})_{0.5}In_{0.5}P$ cladding layer, and a p-type $Ga_{0.5}In_{0.5}P$ layer are sequentially crystal-grown on a semiconductor substrate by metal organic-vapor phase epitaxy at a crystal growth rate of not less than 2.5 μm/h to form a multi-layered structure. A stripe structure is formed on the multi-layered structure, and the stripe structure is sandwiched by an n-type GaAs current blocking layer on both sides. A p-type GaAs contact layer is flatly grown on the stripe structure and the n-type GaAs current blocking layer.

4 Claims, 3 Drawing Sheets

METHOD OF MANUFACTURING SEMICONDUCTOR LASER

BACKGROUND OF THE INVENTION

The present invention relates to a semiconductor laser used as a light source for a laser printer, a bar cord reader, or the like and, more particularly, to a method of manufacturing a visible-light semiconductor laser having an oscillation wavelength of 680 nm or less.

A conventional method of manufacturing a semiconductor laser will be described below. The structure of a semiconductor laser is shown in FIG. 4. According to the conventional method of manufacturing a semiconductor laser, as the first crystal growth, a $GA_{0.5}In_{0.5}P$ active layer 4 serving as a luminescent region is formed on a GaAs substrate 1 at a growth temperature of 700 to 730° C. by metal organic-vapor phase epitaxy (to be referred to as MO-VPE hereinafter) to be interposed between $(Al_{0.7}Ga_{0.3})_{0.5}In_{0.5}P$ cladding layers 3 and 5 each of which has a forbidden band larger than that of the $GA_{0.5}In_{0.5}P$ active layer 4, thereby forming a double-hetero structure.

An oxide film serving as an etching mask for a ridge stripe and a mask for selective growth is formed, and an oxide film stripe is formed in a [0-11] direction by a photoresist method. The resultant structure is etched up to the middle of the p-type cladding layer 5.

Subsequently, the second crystal growth is performed, i.e., selective growth is performed using an oxide film as a mask to form a current blocking layer 7. After the oxide film is removed, a p-type GaAs contact layer 8 is grown on the entire surface of the resultant structure, and electrodes 9 and 10 are arranged, thereby obtaining a conventional semiconductor laser.

A threshold current value of the characteristics of the conventional semiconductor laser considerably depends on the Zn carrier concentration in the p-type cladding layer 5. For example, it is reported that the threshold current value is 38 mA at a carrier concentration of $3.5 \times 10^{17}$ cm$^{-3}$. At this time, the cavity length is 300 $\mu$m, and the maximum continuous wave oscillation temperature is 100° C., but the reliability of the conventional laser is not reported. The conventional laser is described in the Extended Abstracts of the 36th Spring Meeting Japanese Society Applied Physics, 1989 p. 886 1p-ZC-4.

In a $GA_{0.5}In_{0.5}P$ layer used in an AlGaInP semiconductor laser according to the present invention, as reported in Jpn. J. Appl Phys Vol. 27, No. 11, November, 1988, pp. 2089–2106, a band-gap Eg is changed in accordance with a crystal growth temperature Tg in MO-VPE. When the growth temperature is increased, a semiconductor laser having a short emission wavelength. However, when the growth temperature is increased, Zn doping in the p-type cladding layer 5 is generally difficult. Furthermore, Zn doped in an $(Al_yGa_{1-y})_{0.5}In_{0.5}P$ layer is easily diffused. As the growth temperature is increased, the diffusion further progresses. More specifically, when the Zn is doped in an active layer, the reliability of the semiconductor laser is degraded. For this reason, a semiconductor laser having practical characteristics cannot be easily obtained.

SUMMARY OF THE INVENTION

It is an object of the present invention to provide a method of manufacturing a semiconductor laser designed to improve a temperature characteristic.

It is another object of the present invention to provide a method of manufacturing a semiconductor laser in which an oscillation wavelength can be decreased by a high growth temperature.

In order to achieve the above objects, according to the present invention, there is provided a method of manufacturing a semiconductor laser, comprising the steps of sequentially crystal-growing an n-type $(Al_yGa_{1-y})_{0.5}In_{0.5}P$ ($0.5 \leq y \leq 1$) cladding layer, an $(Al_yGa_{1-y})_{0.5}In_{0.5}P$ ($0 \leq z \leq 0.3$) active layer, a p-type $(Al_yGa_{1-y})_{0.5}In_{0.5}P$ cladding layer, and a p-type $Ga_{0.5}In_{0.5}P$ layer on a semiconductor substrate by metal organic-vapor phase epitaxy at a crystal growth rate of not less than 2.5 $\mu$m/h to form a multi-layered structure, forming a stripe structure on the multi-layered structure, the stripe structure being sandwiched by an n-type GaAs current blocking layer on both sides, and flatly growing a p-type GaAs contact layer on the stripe structure and the n-type GaAs current blocking layer.

DESCRIPTION OF THE PREFERRED EMBODIMENTS

Figure 1:
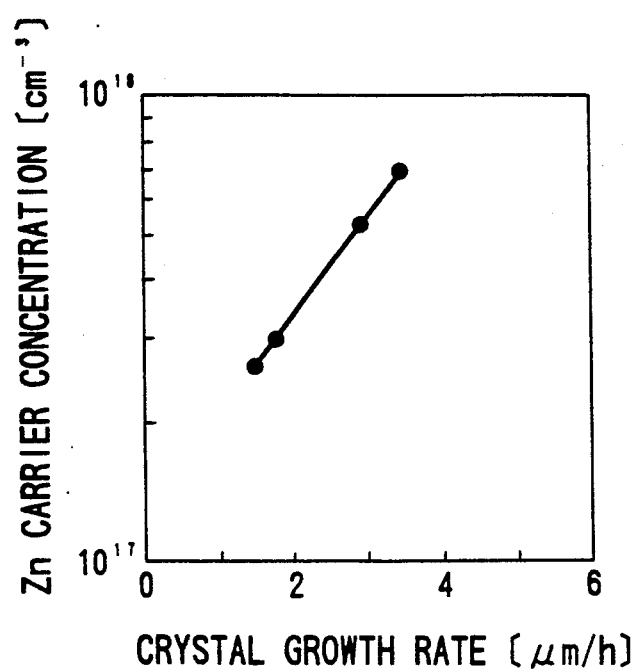
FIG. 1 is a graph showing a relationship between a crystal growth rate and a Zn carrier concentration according to the present invention.

The present invention will be described below with reference to the accompanying drawings. FIG. 1 shows a relationship between a crystal growth rate and a carrier concentration as an effect of the present invention. As growth conditions, the growth temperature is 720° C., and [dimethyl zinc]/[total amount of group III]=-constant. In this manner, when a crystal growth rate is increased, the carrier concentration is varied because a ratio of Zn atoms doped in the crystal to Zn atoms dissociated from the crystal to a vapor phase is varied. When the crystal growth rate is high, since the number of Zn atoms dissociated to a vapor phase is decreased, the carrier concentration can be increased.

Figure 2A:
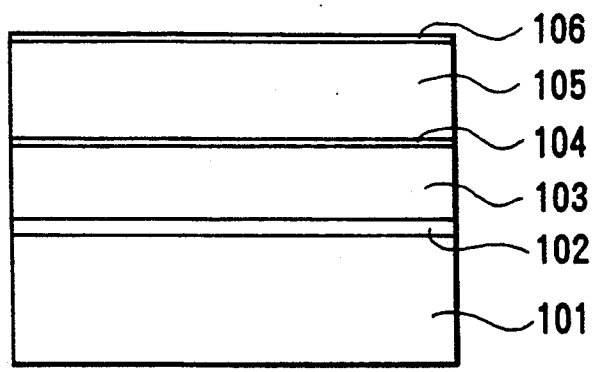
FIGS. 2A to 2C are sectional views showing the steps in manufacturing a semiconductor laser according to an embodiment of the present invention.
Figure 2B:
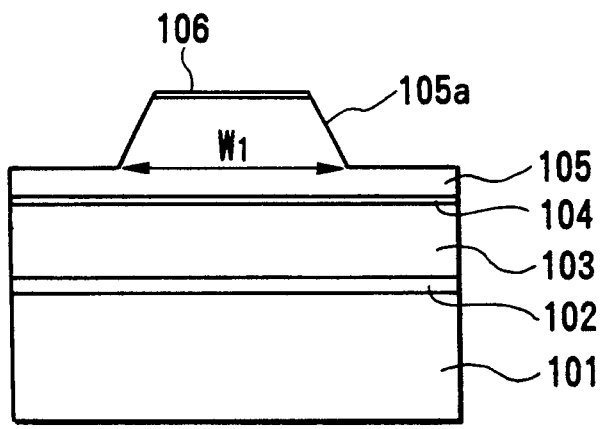
Figure 2C:
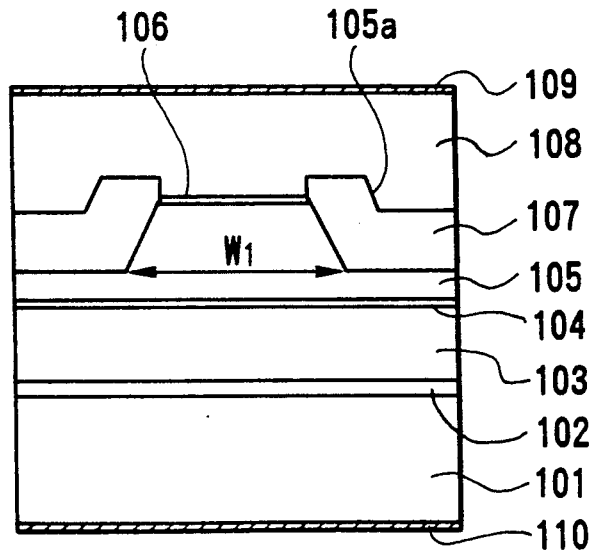

FIGS. 2A to 2C show the steps in manufacturing a semiconductor laser in a crystal growth rate of 3.5 $\mu$m/h of the growth rates in FIG. 1 according to an embodiment of the present invention. The first crystal growth is performed by MO-VPE at a growth temperature of 720° C. and a growth pressure of 30 torr. As a layer structure, as shown in FIG. 2A, an Si-doped n-type GaAs buffer layer 102 having a carrier concentration of $1 \times 10^{18}$ cm$^{-3}$ and a thickness of 0.2 $\mu$m, an Si-doped n-type $(Al_{0.6}Ga_{0.4})_{0.5}In_{0.5}P$ cladding layer 103 having a carrier concentration of $5 \times 10^{17}$ cm$^{-3}$ and a thickness of 1 $\mu$m, an undoped $Ga_{0.5}In_{0.5}P$ active layer 104 having a thickness of 0.07 $\mu$m, a Zn-doped p-type $(Al_{0.6}Ga_{0.4})_{0.5}In_{0.5}P$ cladding layer 105 having a carrier concentration of $5 \times 10^{17}$ cm$^{-3}$ and a thickness of 1 $\mu$m, and a Zn-doped p-type $Ga_{0.5}In_{0.5}P$ layer 106 having a carrier concentration of $1 \times 10^{18}$ cm$^{-3}$ and a thickness of 0.1 μm are stacked on an n-type GaAs substrate 101.

Subsequently, as shown in FIG. 2B, an SiO$_2$ oxide film having a thickness of 0.2 μm and serving as an etching mask for forming a ridge stripe and a mask for selective growth is formed, and an SiO$_2$ oxide film stripe is formed in a [0-11]direction by a photoresist method. The resultant structure is etched by a sulfuric-acid-based etchant using the SiO$_2$ oxide film stripe as an etching mask to leave the p-type cladding layer 105 having a thickness of 0.25 μm, thereby forming a ridge stripe 105a. A ridge width W1 is set to be 5 μm.

As shown in FIG. 2C, as the second crystal growth, selective growth is performed on both the sides of the ridge stripe 105a by MO-VPE at a growth temperature of 650° C. using the SiO$_2$ oxide film on the ridge stripe 105a as a mask to grow an Si-doped n-type GaAs current blocking layer 107 having a carrier concentration of $3 \times 10^{18}$ cm$^{-3}$ and a thickness of 0.8 μm. After the SiO$_2$ oxide film is removed, as the third crystal growth, a Zn-doped p-type GaAs contact layer 108 having a carrier concentration of $2 \times 10^{18}$ cm$^{-3}$ and a thickness of 3 μm is formed on the entire surface of the resultant structure, and electrodes 109 and 110 are formed, thereby obtaining a semiconductor laser. As the characteristics of the semiconductor laser, the threshold current value is 35 to 30 mA at a cavity length of 350 μm, the oscillation wavelength is 670 nm, and the maximum continuous wave oscillation temperature is up to 110° C.

In a method of manufacturing the above semiconductor laser, doping efficiency of a p-type dopant into a p-type $(Al_yGa_{1-y})_{0.5}In_{0.5}P$ cladding layer is increased by increasing a crystal growth rate. At a high growth temperature for decreasing the oscillation wavelength, a sufficient carrier concentration can be obtained, total crystal growth time is shortened, and the dopant doped in the p-type cladding layer can be rarely diffused in the active layer.

Figure 3:
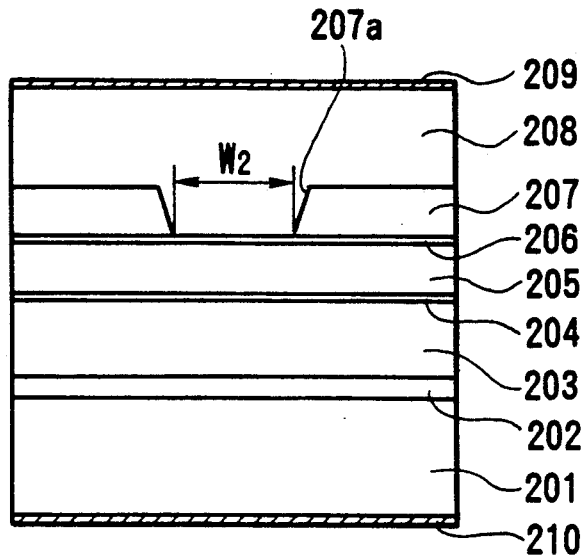
FIG. 3 is a sectional view showing a semiconductor laser according to another embodiment of the present invention.
Figure 4:
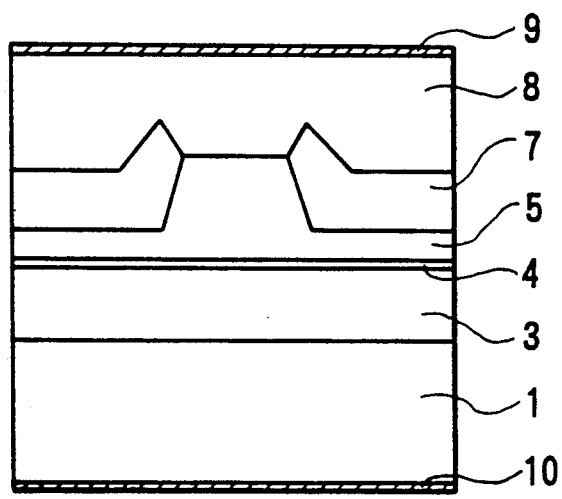
FIG. 4 is a sectional view showing a conventional semiconductor laser.

FIG. 3 shows a semiconductor laser according to another embodiment of the present invention. After the first crystal growth is performed under the same growth conditions as those in FIG. 2A to 2C until an n-type GaAs current blocking layer 207, a stripe-like trench 207a having a width W2 is formed by an phosphoric-acid-based etchant by a photoresist method in a [0-11]direction. Subsequently, as the second crystal growth, a Zn-doped p-type GaAs contact layer 208 having a carrier concentration of $2 \times 10^{19}$ cm$^{-3}$ and a thickness of 3 μm is grown on the entire surface of the resultant structure at a growth temperature of 650° C. by MO-VPE, and electrodes 209 and 210 are formed, thereby obtaining a semiconductor laser. As the characteristics of the semiconductor laser, the threshold current value is 75 mA at a cavity length of 300 μm, the oscillation wavelength is 670 nm, and the maximum continuous wave oscillation temperature is up to 120° C.

As described above according to the present invention, when doping efficiency of Zn serving as a p-type dopant is increased by setting a crystal growth rate at 2.5 μm/h or more as shown in FIG. 1, a semiconductor laser having laser characteristics which can withstand a high temperature, e.g., a temperature of 720° C. in a practical application can be obtained. As a reason for this, since a time for holding the layers at a high temperature during a plurality of crystal growth cycles is shortened, Zn which is easily diffused in the crystal can be rarely diffused from the p-type cladding layer 205 to the active layer 204. A p-n junction which is steeper than that of the p-n junction of a conventional semiconductor laser can be obtained, and the temperature characteristic is improved. For example, the semiconductor laser shown in FIG. 2 has a threshold current value of 40 mA and an oscillation wavelength of 670 nm at a cavity length of 350 μm. In a constant light output test at a temperature of 70° C. to obtain a light output of 5 mW, the semiconductor laser obtains a service life of 5,000 hours or more.

In addition, since a time for one crystal growth cycle is shortened, productivity is improved.

What is claimed is:

1. A method of manufacturing a semiconductor laser, comprising the steps of:

sequentially crystal-growing an n-type $(Al_yGa_{1-y})_{0.5}In_{0.5}P$ ($0.5 \leq y \leq 1$) cladding layer, an $(Al_yGa_{1-y})_{0.5}In_{0.5}P$ ($0 \leq z \leq 0.3$) active layer, a p-type $(Al_yGa_{1-y})_{0.5}In_{0.5}P$ cladding layer, and a p-type $Ga_{0.5}In_{0.5}P$ layer on a semiconductor substrate by metal organic-vapor phase epitaxy at a crystal growth rate of not less than 2.5 μm/h to form a multi-layered structure;

forming a stripe structure on said multi-layered structure, said stripe structure being sandwiched by an n-type GaAs current blocking layer on both sides; and flatly growing a p-type GaAs contact layer on said stripe structure and said n-type GaAs current blocking layer.

2. A method according to claim 1, wherein said stripe structure is formed by etching said p-type $(Al_yGa_{1-y})_{0.5}In_{0.5}P$ cladding layer in a ridge-stripe shape.

3. A method according to claim 1, wherein said stripe structure is formed by growing and stacking a p-type GaAs contact layer on said multi-layered structure and etching a stripe-like trench in said p-type GaAs contact layer.

4. A method according to claim 1, wherein crystal growth is performed under crystal growth conditions as at least a growth temperature of about 720° C., [dimethyl zinc]/[group III total amount]=constant, and the crystal growth rate of not less than 2.5 μm/h, to improve doping efficiency of a p-type dopant in said p-type $(Al_yGa_{1-y})_{0.5}In_{0.5}P$ cladding layer.

* * * * *

UNITED STATES PATENT AND TRADEMARK OFFICE
CERTIFICATE OF CORRECTION

PATENT NO. : 5,298,456
DATED : March 29, 1994
INVENTOR(S) : Kosei Unozawa

It is certified that error appears in the above-indentified patent and that said Letters Patent is hereby corrected as shown below:

On the title page, insert item [73]
    Assignee: NEC Corporation
              Tokyo, Japan Signed and Sealed this Thirtieth Day of April, 1996

Attest:

BRUCE LEHMAN

*Attesting Officer*      *Commissioner of Patents and Trademarks*